US 6,582,566 B2

(12) United States Patent
List et al.

(10) Patent No.: US 6,582,566 B2
(45) Date of Patent: Jun. 24, 2003

(54) PROCESS AND DEVICE FOR REDUCING THE IGNITION VOLTAGE OF PLASMAS OPERATED USING PULSES OF PULSED POWER

(75) Inventors: Matthias List, Dresden (DE); Uwe Krause, Oschersleben (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 0 days.

(21) Appl. No.: 09/970,985

(22) Filed: Oct. 5, 2001

(65) Prior Publication Data

US 2002/0043336 A1 Apr. 18, 2002

(30) Foreign Application Priority Data

Oct. 18, 2000 (DE) .......................................... 100 51 508

(51) Int. Cl.[7] ........................ C23C 14/00; C23C 16/00; H05H 1/24
(52) U.S. Cl. ............................. 204/192.1; 204/298.08; 427/445; 427/569; 118/723 MW; 118/723 E; 118/715
(58) Field of Search .......................... 204/192.1, 298.08; 118/723 MW, 723 E, 715; 427/445, 569

(56) References Cited

U.S. PATENT DOCUMENTS

| 5,231,057 | A | * | 7/1993 | Doki et al. ................ 437/225 |
| 5,300,205 | A |   | 4/1994 | Fritsche ................. 204/192.12 |
| 5,997,687 | A | * | 12/1999 | Koshimizu ................ 156/345 |
| 6,005,218 | A | * | 12/1999 | Walde et al. ........... 219/121.54 |

FOREIGN PATENT DOCUMENTS

| DE | 4438463 | 2/1996 | ............ H05H/1/46 |
| DE | 19616187 | 11/1997 | ............ H05H/1/46 |
| DE | 19643925 | 5/1998 | ............ H05H/1/46 |
| DE | 19717127 | 10/1998 | ............ H05H/1/46 |

OTHER PUBLICATIONS

Surface and Coatings Technology vol. 122, 1999.

* cited by examiner

Primary Examiner—Steven H. VerSteeg
(74) Attorney, Agent, or Firm—Greenblum & Bernstein, P.L.C.

(57) ABSTRACT

Process and device for reducing an ignition voltage of power pulses in plasmas operated in a pulsed manner with long pulse-off times. The process includes generating a power pulsed plasma at a pulse duty factor, the pulse duty factor being a ratio of pulse-on time to pulse-off time, and at least before the beginning of the pulse-on time of the power pulses, producing charge carriers using an additional plasma discharge at a lower power than that of the power pulses. The device includes a vacuum chamber including at least one pump system, an arrangement for producing plasma, the arrangement including at least one anode and at least one cathode, an energy source connected to the cathode and the anode which can be pulsed in the frequency range of between approximately 10 Hz to approximately 1 MHZ, and a mechanism for one of producing an additional plasma discharge.

14 Claims, 2 Drawing Sheets

PROCESS AND DEVICE FOR REDUCING THE IGNITION VOLTAGE OF PLASMAS OPERATED USING PULSES OF PULSED POWER

CROSS-REFERENCE TO RELATED APPLICATIONS

The present application claims priority under 35 U.S.C. §119 of German Patent Application No. 100 51 508.8, filed on Oct. 18, 2000, the disclosure of which is expressly incorporated by reference herein in its entirety.

BACKGROUND OF THE INVENTION

1. Field of the Invention

The invention relates to a process and to related devices for reducing the ignition voltage of plasmas operated using pulses of pulsed power with a long pulse-off time. Such plasmas are used for treating substrates in, e.g., atomization processes which utilize vacuum coating devices, in plasma activation as part of various coating processes, and in other processes utilizing vacuum technology. Cathode atomization processes, also known as sputtering, represent a primary area of application for pulsed plasmas within the coating technology. With their aid, many things such as components, tools, partially finished products, as well as finished products which are used in optics and mechanical engineering can be coated. Many parts, such as those used in the packaging, glass, and electronics industries are also coated with individual layers or layer systems being deposited on a respective substrate.

2. Discussion of Background Information

In deposited layer systems of this type, bonding agent layers and functional layers with layer thicknesses of only a few nanometers are usually required. In order to deposit layers with such low layer thicknesses, the feed rate of the substrate during the coating process can usually be selected as being set relatively high, in order to shorten the coating duration, or the lag time of the substrate in the coating zone can be kept low, or the electrical power applied can be set very low, which leads to a low depositing of material on the targets of the atomization cathodes, and to a low growth rate of the layers to be deposited.

The substrate speed or the lag time has often been determined by the depositing rates of other layers present in the layer system or to be deposited subsequently. Because of the required stability of the coating plasma, an arbitrary reduction of the electrical power applied is not possible because if the power density is too low, it causes inhomogeneities in the coating plasma and therefore layer inhomogeneities and instability of the coating process. This is particularly problematic in the case of larger cathode arrangements. In practice, stable coating plasmas with a low power feed are presently possible only by using blinds and/or by covering of the sputtering cathodes. This, however, results in a considerable loss of effectiveness.

The bonding agent and functional layers mentioned above are pivotal in determining the properties of the entire layer system, based on their physical properties. Thus, it is important to deposit very thin layers, with precisely defined properties, having a high degree of evenness and reproducibility of these properties, in order to achieve certain target parameters of the entire layer system.

Research has shown that, with the aid of high power densities on the target, the properties of deposited layers can be influenced and, optionally, improved, i.e., Kouznetsov et al., "A Novel Pulsed Magnetron Technique Using Very High Target Power Densities," Surface and Coatings Technology, Vol. 122, 1999, pages 290–293, the disclosure of which is expressly incorporated by reference in its entirety.

Thus, it is often physically necessary to deposit very thin and/or slowly growing layers on the target, as well as using high power densities.

Devices are already known that, with the aid of a pulsed power supply, produce pulses with high electric pulse power utilizing, at the same time, a low average introduced electric power, e.g., DE 41 27 317 A1, the disclosure of which is expressly incorporated by reference in its entirety. The result is a high plasma density on the sputtering target during the pulse-on time. This stabilizes the sputtering plasma at low average electric power levels. However, at the time of coating, a high plasma density is constantly available on the target. The deciding disadvantage of this arrangement lies in the fact that, due to pulse-off times during re-ignition of the discharge on the target, a high ignition voltage results. The value of the ignition voltage depends primarily on the ratio of the pulse-on time to the pulse-off time and the length of the pulse-off time. If the pulse-off times are increased and the pulse-on times are decreased, a very high plasma density on the sputtering target will indeed be achieved at the same average electric power; however, as a result of the long pulse-off time the ignition voltage increases to values that lie substantially above the burning voltage of the plasma and may amount to several kilovolts. This can again cause damage in the various switching arrangements and undesired arcs. Such a result is caused by the fact that, during the long pulse-off time, i.e., at pulse-off times of greater than approximately 1 $\mu$s, a sputtering plasma becomes depleted of charge carriers and, as a result, may go out. At the beginning of each pulse, the production of charge carriers must occur again until enough charge carriers are present that ensure that the initially excessive ignition voltage is decreased to the value of the actual burning voltage of the sputtering plasma.

The problem described above generally occurs in plasmas that are pulsed at medium frequency. Wherever the pulse duty factor, i.e., the ratio between pulse-on and pulse off times, is set in such a way that the pulse-off time increases above a critical value or when a longer pulse-off time is necessary for another reason, the critical excesses in ignition voltage may occur.

SUMMARY OF THE INVENTION

The invention provides for a process for operating pulsed plasmas which, independently of the pulse-off time, causes an increase in ignition voltage that is as low as possible relative to the burning voltage of the plasma. The process should be suitable in various devices for various vacuum technology processes.

The invention provides for a process for reducing an ignition voltage of power pulses in plasmas operated in a pulsed manner with long pulse-off times, the process comprising generating a power pulsed plasma at a pulse duty factor, the pulse duty factor being a ratio of pulse-on time to pulse-off time, and at least before the beginning of the pulse-on time of the power pulses, producing charge carriers using an additional plasma discharge at a lower power than that of the power pulses.

The charge carriers may be produced by the additional plasma discharge during the entire pulse-off time of the power pulses. The charge carriers may be produced by the additional plasma discharge during part of the pulse-off time of the power pulses. The charge carriers may be produced by the additional plasma discharge partially during the pulse-on time of the power pulses. The charge carriers may be produced by the additional plasma discharge during the entire pulse-off time and pulse-on time of the power pulses. The charge carriers may be produced in a pulsed manner by the additional plasma discharge. The process may further comprise feeding the additional plasma discharge using a separate energy supply device. The process may further comprise regulating a power density of the additional plasma discharge.

The invention also provides for a device for reducing an ignition voltage of power pulses in plasmas operated in a pulsed manner, the device comprising a vacuum chamber or vessel including at least one pump system. An arrangement for producing plasma is provided and the arrangement includes at least one anode and at least one cathode. An energy source is connected to the cathode and the anode which can be pulsed in the frequency range of between approximately 10 Hz to approximately 1 MHz. A mechanism for one of producing an additional plasma discharge is also provided.

The mechanism for producing the additional plasma discharge may be adapted to regulate the additional plasma discharge. The mechanism for producing the additional plasma discharge may comprise at least one device for producing an RF discharge. The mechanism for producing the additional plasma discharge may comprise at least one device for the producing a microwave discharge in the GHz frequency range.

The invention further provides a device for producing a pulsed plasma comprising a vacuum chamber or vessel including at least one pump system. An arrangement for producing plasma is provided and the arrangement includes at least one anode and at least one cathode. An energy source is connected to the cathode and the anode which can be pulsed in at frequency range. A mechanism for one of producing an additional plasma discharge is provided. An ignition voltage of power pulses in the plasma utilizes long pulse-off times. The pulsed plasma is generated at a pulse duty factor, the pulse duty factor being a ratio of pulse-on time to pulse-off time, wherein, at least before the beginning of the pulse-on time of the power pulses, charge carriers are produced using the additional plasma discharge at a lower power than that of the power pulses.

The invention also contemplates a process for producing a pulsed plasma in a device which includes a vacuum chamber or vessel including at least one pump system, an arrangement for producing plasma which includes at least one anode and at least one cathode, an energy source connected to the cathode and the anode which can be pulsed in at frequency range, a mechanism for one of producing an additional plasma discharge, wherein an ignition voltage of power pulses in the plasma utilizing long pulse-off times, the process comprising generating the pulsed plasma at a pulse duty factor, the pulse duty factor being a ratio of pulse-on time to pulse-off time, and at least before the beginning of the pulse-on time of the power pulses, producing charge carriers using the additional plasma discharge at a lower power than that of the power pulses.

The invention is based on the realization that only a fraction of the charge carrier density of technological plasma is necessary in order to effectively prevent highly excessive ignition voltages. If, during the pulse-off times, the plasma is prevented from completely going out or the charge carrier density in the discharge chamber is prevented from decreasing to below a certain low amount, an ignition voltage will occur at the beginning of the following pulse which is only slightly increased relative to the burning voltage of the plasma. The technological purpose of a long pulse-out time, such as, e.g., to guarantee an increased pulse performance with a lower overall average power of the plasma discharge or to prevent defective operating states by using prolonged recovery times, and to prevent additional pulse pauses, is achieved in many cases in spite of the additional charge carrier density.

The process can, in particular, be used for the purpose of producing medium frequency pulsed sputtering plasmas in depositing very thin layers, which leads to a distinct improvement in layer properties. For this purpose, a pulsed energy supply may be connected to a cathode that contains a target made of the material to be sputtered and an anode. The direct current voltage source is characterized in that it operates in the frequency range of between approximately 10 Hz to approximately 1 MHz at possible ratios of pulse-on time to pulse-off time of between approximately 1:1 to approximately 1:100 and above. Thus, it is guaranteed that, at a low average introduced electric power, a high pulse power is produced in the pulse-on time of the discharge.

A second discharge is combined with and/or overlapped with the first such that sufficient charge carriers are produced in the pulse-off time. The task of the second discharge does not lie in sustaining another sputtering plasma and/or a stable discharge for sputtering the target, but rather in maintaining only a certain minimum density of charge carriers during the pulse-off time for the first discharge, which is used for coating. The charge carriers produced in this manner serve to alter the ignition process at the beginning of the pulse-on time of the discharge used for coating, in such a way that the ignition voltage is significantly reduced because of the charge carriers that are present and, in the most favorable case, the burning voltage is approximated. The result is that even very long pulse-off times and very short pulse-on times, which are associated therewith in the exemplary case, can be used. This allows an increase in the power density on the sputtering target at the same average introduced electric power, without the power supply being burdened with a highly excessive ignition voltage.

According to the invention, the ignition voltage may be decoupled from the parameter of the pulse-off time. In such a case, it would depend only on the density of the charge carriers, which are provided by the second discharge.

It is also possible to operate the second discharge in a regulated manner in such a way that the ignition voltage of the power pulses is adjusted to a predetermined value. This is advantageous if, on the one hand, a particular value of the ignition voltage may not be exceeded and, on the other hand, if as low a plasma density as possible is to be present between the individual power pulses.

Other exemplary embodiments and advantages of the present invention may be ascertained by reviewing the present disclosure and the accompanying drawing.

BRIEF DESCRIPTION OF THE DRAWINGS

The present invention is further described in the detailed description which follows, in reference to the noted plurality of drawings by way of non-limiting examples of exemplary embodiments of the present invention, in which like reference numerals represent similar parts throughout the several views of the drawings, and wherein.

DETAILED DESCRIPTION OF THE PRESENT INVENTION

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description taken with the drawings making apparent to those skilled in the art how the several forms of the present invention may be embodied in practice.

Figure 1:
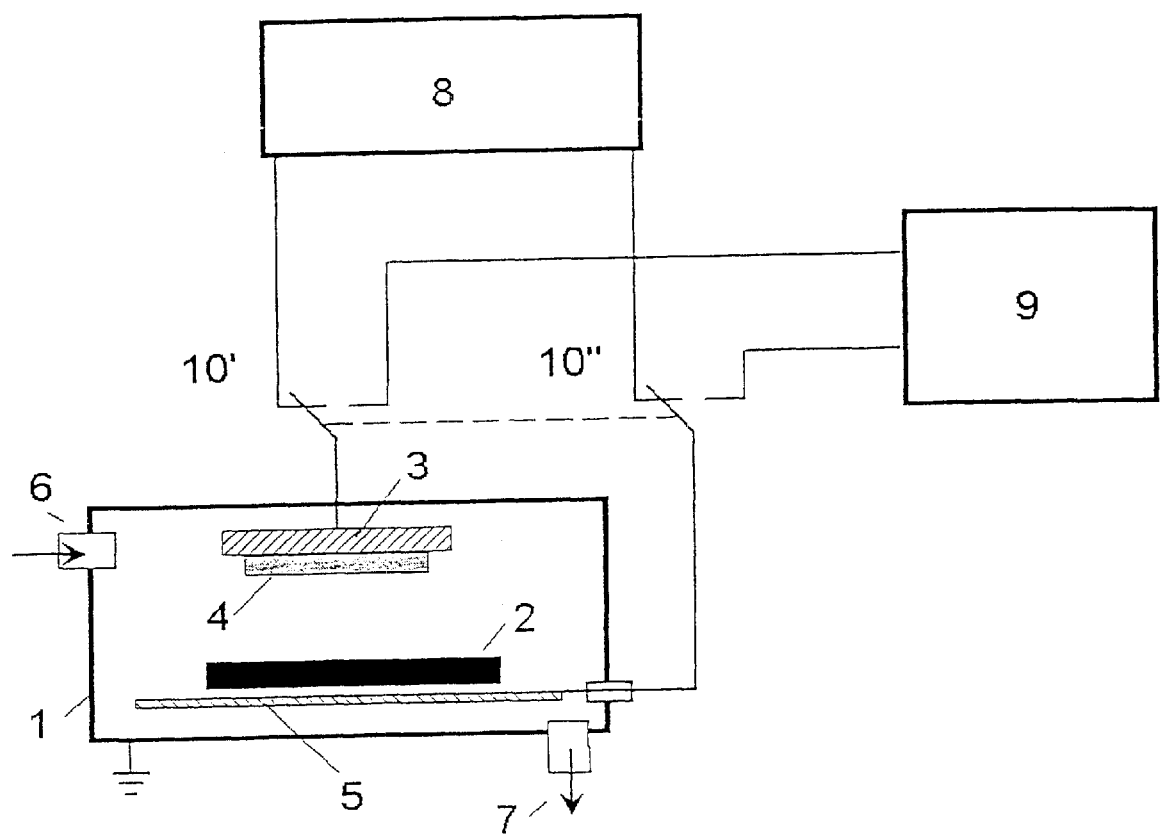
FIG. 1 shows a device for performing a process in which both plasma discharges are each ignited between the same electrodes.

FIG. 1 illustrates a sputtering device which is located in a vacuum chamber or vessel 1 of a vacuum coating installation, i.e., one which is used for depositing thin silver layers, e.g., between approximately 1 nm–10 nm, on a substrate 2 made of glass. The sputtering system includes a Magnetron 3 acting as a cathode with a silver target 4. An anode 5 is arranged in the chamber 1 of the vacuum coating device in an electrically insulated manner. A gas inlet system 6 and a pump system 7 are also connected to the chamber 1 of the vacuum coating device.

Two sources of electrical energy are necessary for implementing the process according to the invention. The first energy source is a high-energy power source 8 and the second energy source is a pulsed lower-powered voltage source 9. Two switches 10', 10" allow either the pulsed lower-powered voltage source 9 or the high-energy power source 8 to be connected to the Magnetron 3 and the anode 5.

The goal here is to produce a high pulse power at a low average introduced electric power. In this manner, it is possible to achieve a high plasma density with a good evenness of the sputtering plasma during the pulse-on time.

In order to guarantee a high performance during the pulse-on time with a low average introduced electrical power, a ratio of pulse-on time to pulse off time of approximately 1:19 is selected. The process may be performed with the device as follows:

The supply of the energy from the high-energy power supply 8 into the discharge path between the anode 5 and the cathode is operated with a pulse frequency of approximately 5 kHz. At a ratio of the pulse-on time to the pulse-off time of approximately 1:19, this means that the high-energy power supply 8 feeds energy into the discharge path for a period of approximately 10 µs and then does not feed any energy into the discharge path for approximately 190 µs.

The coupling of the high-energy power supply 8 with the pulsed lower-powered voltage source 9 occurs in such a way as to ensure that the coupling is closed only during the pulse-off times of the high-power energy source 8. The electrical output of the lower-powered voltage source 9 is set such that it is not sufficient to produce a stable sputtering process on the target 4. The discharge maintained by the pulsed lower-powered voltage source 9 only serves to create charge carriers during the pulse-off time. There are no particular requirements for the evenness of this discharge.

The pulsed lower-powered voltage source 9 is connected to the discharge path at a frequency of approximately 200 kHz for the entire duration of the pulse-off time of the sputtering plasma. This ensures that, at the beginning of the pulse-on time of the sputtering plasma, sufficient charge carriers are present in the discharge path and thus the value of the ignition voltage in each pulse of the sputtering plasma approximately corresponds to the value of the burning voltage. During the pulse-on time of the sputtering plasma, the pulsed lower-powered voltage source 9 is switched off and/or separated from the Magnetron 3 and the anode 5, and only the high-energy power source 8 is supplying energy in the form of power pulses.

Because of the high pulse power during the pulse-on time of the sputtering plasma, a very high plasma density results in the discharge path in the vicinity of the target 4. The result is that, because of the high pulse energy during the pulse-on time, a stable discharge, and thus a stable sputtering process, with a high degree of evenness and reproducibility is attained, even with an overall lower average introduced electric energy.

The silver layer is thus deposited very evenly with a low average electrical energy and, correspondingly, at a lower growth rate. The layer properties are also positively influenced by the high pulse energy levels. They emulate the properties of silver layers that are deposited at a significantly higher average energy level.

One advantage of this invention is that no additional plasma production device is necessary for maintaining the second discharge by way of the constant switching between the high-energy power source 8 and the pulsed lower-powered voltage source 9.

Figure 2:
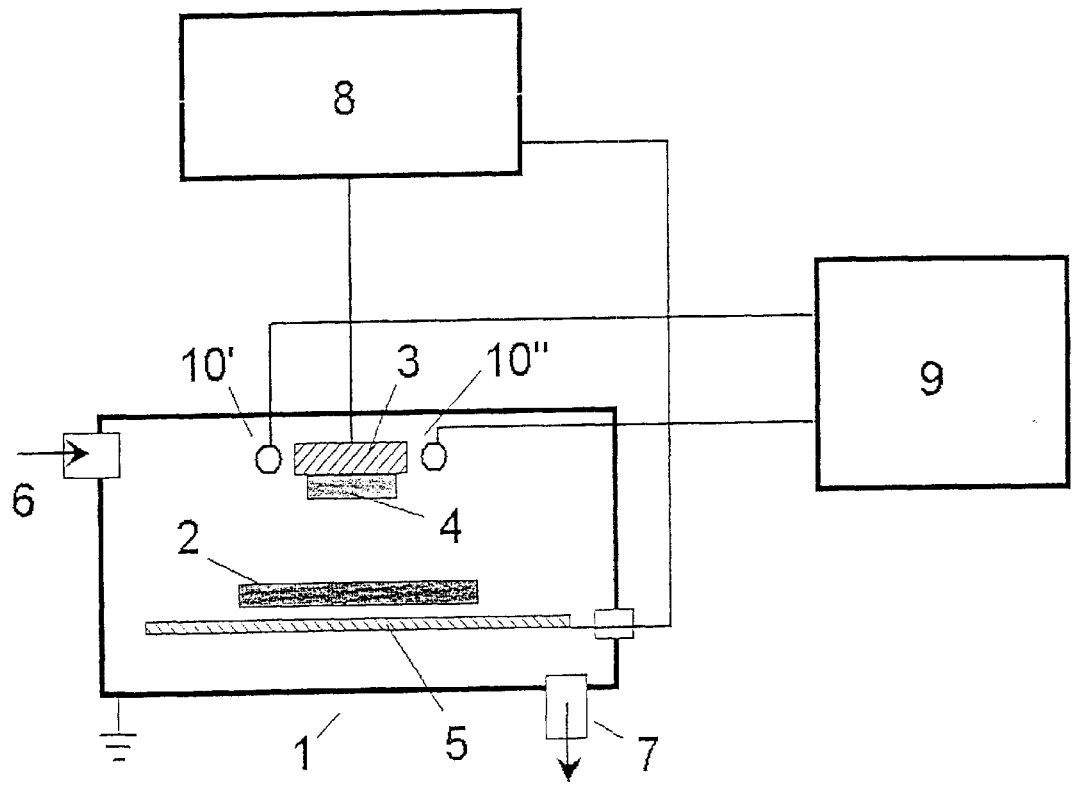
FIG. 2 shows another device for performing a process in which both plasma discharges are ignited between different electrodes.

FIG. 2 shows another sputtering device which is located in the chamber 1 of a vacuum coating device that is used to deposit thin titanium layers that are approximately 100 nm thick on a substrate 2 made of glass. The sputtering system includes a Magnetron 3 acting as a cathode with a titanium target 4. An anode 5 is arranged in the chamber 1 of the vacuum coating device in an electrically insulated manner. A gas inlet system 6 and a pump system 7 are also connected to the chamber 1 of the vacuum coating device.

In order to implement the process according to the invention, the discharges of two independent plasma production devices are overlapped. The actual sputtering process for sputtering the titanium target 4 is performed by way of a pulsed high-energy power supply 8 with a frequency of approximately 1 kHz and a ratio of pulse-on time to pulse-off time of approximately 1:49. The pulse-on time of the discharge of the sputtering plasma is approximately 20 µs and the pulse-off time is approximately 980 µs.

This pulsed discharge of the sputtering plasma is overlapped with a RF discharge utilizing a frequency of approximately 13.56 MHz. In order to produce the RF discharge, a RF voltage source 9 is connected here to two separate RF electrodes 10', 10" that are arranged in the region of the titanium target 4. The RF electrodes 10', 10" are made of the target material of titanium as well. The RF electrodes 10', 10" are electrically isolated from the cathode and the anode 5.

The goal of producing a high pulse power with a low average introduced electric power without needing to compensate a significant increase in ignition voltage at the beginning of a pulse is present in this exemplary embodiment as well. By way of the pulse duty factor described, the plasma density can be increased so sharply during the short pulse-on time of the sputtering plasma that, in spite of low average introduced electric power, a titanium layer is deposited which has a significantly lower degree of roughness. Such a roughness can otherwise only be attained in titanium layers that are deposited with a significantly greater average power density. Because of the high power during the pulse-on time of the sputtering plasma, however, such a high power and plasma density occurs on the titanium target 4 that it allows the properties of the deposited layer such as, e.g., the roughness, can be positively influenced in spite of the subsequent long pulse-off time.

By utilizing of the RF discharge overlapping the pulsed sputtering process, a sufficiently high charge carrier density is maintained during the pulse-off time of the sputtering process, such that the ignition voltage of the pulsed sputtering process is hardly increased, in spite of the long pulse-off time of approximately 980 $\mu$s. The overlapped RF discharge does not contribute to the coating of the substrate 2. However, it is advantageous to produce the RF electrodes 10', 10", as described in the exemplary embodiment, from the same material as the current target material.

It is noted that the foregoing examples have been provided merely for the purpose of explanation and are in no way to be construed as limiting of the present invention. While the present invention has been described with reference to an exemplary embodiment, it is understood that the words which have been used herein are words of description and illustration, rather than words of limitation. Changes may be made, within the purview of the appended claims, as presently stated and as amended, without departing from the scope and spirit of the present invention in its aspects. Although the present invention has been described herein with reference to particular means, materials and embodiments, the present invention is not intended to be limited to the particulars disclosed herein; rather, the present invention extends to all functionally equivalent structures, methods and uses, such as are within the scope of the appended claims.

What is claimed:

1. A process for reducing an ignition voltage of power pulses in plasmas operated in a pulsed manner with long pulse-off times, the process comprising:
   generating a power pulsed plasma at a pulse duty factor, the pulse duty factor being a ratio of pulse-on time to pulse-off time; and
   at least before the beginning of the pulse-on time of the power pulses, producing charge carriers using an additional plasma discharge at a lower power than that of the power pulses.

2. The process of claim 1, wherein the charge carriers are produced by the additional plasma discharge during the entire pulse-off time of the power pulses.

3. The process of claim 1, wherein the charge carriers are produced by the additional plasma discharge during part of the pulse-off time of the power pulses.

4. The process of claim 1, wherein the charge carriers are produced by the additional plasma discharge partially during the pulse-on time of the power pulses.

5. The process of claim 1, wherein the charge carriers are produced by the additional plasma discharge during the entire pulse-off time and pulse-on time of the power pulses.

6. The process of claim 1, wherein the charge carriers are produced in a pulsed manner by the additional plasma discharge.

7. The process of claim 1, further comprising feeding the additional plasma discharge using a separate energy supply device.

8. The process of claim 1, further comprising regulating a power density of the additional plasma discharge.

9. A device for reducing an ignition voltage of power pulses in plasmas operated in a pulsed manner, the device comprising:
   a vacuum chamber including at least one pump system;
   an arrangement for producing plasma, the arrangement including at least one anode and at least one cathode;
   an energy source connected to the cathode and the anode which can be pulsed in the frequency range of between approximately 10 Hz to approximately 1 MHZ; and
   a mechanism for producing an additional plasma discharge.

10. The device of claim 9, wherein the mechanism for producing the additional plasma discharge is adapted to regulate the additional plasma discharge.

11. The device of claim 9, wherein the mechanism for producing the additional plasma discharge comprises at least one device for producing an RF discharge.

12. The device of claim 9, wherein the mechanism for producing the additional plasma discharge comprises at least one device for producing a microwave discharge in the GHz frequency range.

13. A device for producing a pulsed plasma comprising:
   a vacuum chamber including at least one pump system;
   an arrangement for producing plasma, the arrangement including at least one anode and at least one cathode;
   an energy source connected to the cathode and the anode which can be pulsed in a frequency range;
   a mechanism for one of producing an additional plasma discharge,
   an ignition voltage of power pulses in the plasma utilizing long pulse-off times,
   wherein the pulsed plasma is generated at a pulse duty factor, the pulse duty factor being a ratio of pulse-on time to pulse-off time, and
   wherein, at least before the beginning of the pulse-on time of the power pulses, charge carriers are produced using the additional plasma discharge at a lower power than that of the power pulses.

14. A process for producing a pulsed plasma in a device which includes a vacuum chamber including at least one pump system, an arrangement for producing plasma which includes at least one anode and at least one cathode, an energy source connected to the cathode and the anode which can be pulsed in a frequency range, a mechanism for one of producing an additional plasma discharge, wherein an ignition voltage of power pulses in the plasma utilizing long pulse-off times, the process comprising:
   generating the pulsed plasma at a pulse duty factor, the pulse duty factor being a ratio of pulse-on time to pulse-off time; and
   at least before the beginning of the pulse-on time of the power pulses, producing charge carriers using the additional plasma discharge at a lower power than that of the power pulses.

* * * * *